United States Patent
Dickie

(10) Patent No.: US 9,935,650 B2
(45) Date of Patent: *Apr. 3, 2018

(54) COMPRESSION OF FLOATING-POINT DATA BY IDENTIFYING A PREVIOUS LOSS OF PRECISION

(71) Applicant: International Business Machines Corporation, Armonk, NY (US)

(72) Inventor: Garth A. Dickie, Framingham, MA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 108 days.

This patent is subject to a terminal disclaimer.

(21) Appl. No.: 14/638,728

(22) Filed: Mar. 4, 2015

(65) Prior Publication Data

US 2015/0288381 A1    Oct. 8, 2015

Related U.S. Application Data

(63) Continuation of application No. 14/246,725, filed on Apr. 7, 2014.

(51) Int. Cl.
*G06F 7/483* (2006.01)
*H03M 7/00* (2006.01)
*H03M 7/24* (2006.01)

(52) U.S. Cl.
CPC .............. *H03M 7/00* (2013.01); *G06F 7/483* (2013.01); *H03M 7/24* (2013.01)

(58) Field of Classification Search
None
See application file for complete search history.

(56) References Cited

U.S. PATENT DOCUMENTS

| | | | |
|---|---|---|---|
| 5,058,144 | A | 10/1991 | Fiala |
| 5,467,087 | A | 11/1995 | Chu |
| 5,603,022 | A | 2/1997 | Ng et al. |
| 5,729,228 | A | 3/1998 | Franaszek |
| 5,964,842 | A | 10/1999 | Packard |

(Continued)

FOREIGN PATENT DOCUMENTS

| | | |
|---|---|---|
| CN | 101711001 A | 5/2010 |
| EP | 2387004 A1 | 11/2011 |

(Continued)

OTHER PUBLICATIONS

Wolfram MathWorld, "Fundamental Theorem of Arithmetic", 2012, retrieved from https://web.archive.org/web/20120704180459/http://mathworld.wolfram.com/FundamentalTheoremofArithmetic.html.

(Continued)

*Primary Examiner* — David H Malzahn
(74) *Attorney, Agent, or Firm* — Erik K. Johnson; Edell, Shapiro & Finnan, LLC

(57) ABSTRACT

Each binary floating-point value in a set of binary floating-point values is converted to a decimal floating-point value. Data are determined including an exponent, a mantissa and a quantity of decimal digits of the mantissa for each decimal floating-point value. The exponents, the mantissas and the quantity of decimal digits are individually compressed to produce compressed floating-point values based on the individual compressions.

8 Claims, 3 Drawing Sheets

(56) References Cited

U.S. PATENT DOCUMENTS

| | | |
|---|---|---|
| 6,195,024 B1 | 2/2001 | Fallon |
| 6,253,222 B1 | 6/2001 | Dyer |
| 6,373,986 B1 | 4/2002 | Fink |
| 6,396,420 B1 | 5/2002 | Augustine |
| 6,462,680 B1 | 10/2002 | Hayes |
| 6,577,254 B2 | 6/2003 | Rasmussen |
| 6,624,761 B2 | 9/2003 | Fallon |
| 6,885,319 B2 | 4/2005 | Geiger |
| 7,024,414 B2 | 4/2006 | Sah et al. |
| 7,139,765 B1 | 11/2006 | Balkany et al. |
| 7,453,377 B2 | 11/2008 | Lee et al. |
| 7,529,752 B2 | 5/2009 | Hinshaw et al. |
| 7,612,694 B1 | 11/2009 | Schneider |
| 7,647,552 B2 | 1/2010 | Wan |
| 7,652,596 B1 | 1/2010 | Sharma |
| 7,991,811 B2 | 8/2011 | Carlson et al. |
| 8,065,337 B2 | 11/2011 | Furusho |
| 8,108,355 B2 | 1/2012 | Zhang |
| 8,108,361 B2 | 1/2012 | Netz |
| 8,126,855 B2 | 2/2012 | Faerber et al. |
| 8,719,322 B2 | 5/2014 | Bishop |
| 9,350,384 B2 | 5/2016 | Ackerman et al. |
| 9,356,621 B2 | 5/2016 | Ackerman et al. |
| 9,405,858 B2 | 8/2016 | Attaluri |
| 9,450,603 B2 | 9/2016 | Dickie |
| 9,514,147 B2 | 12/2016 | Ackerman et al. |
| 9,514,148 B2 | 12/2016 | Ackerman et al. |
| 9,514,149 B2 | 12/2016 | Ackerman et al. |
| 9,519,651 B2 | 12/2016 | Ackerman et al. |
| 9,535,923 B2 | 1/2017 | Ackerman et al. |
| 9,608,664 B2 | 3/2017 | Dickie |
| 9,614,543 B2 | 4/2017 | Dickie |
| 9,628,107 B2 * | 4/2017 | Dickie .................... G06F 7/483 |
| 2001/0031092 A1 | 10/2001 | Zeck |
| 2001/0051941 A1 | 12/2001 | Tonomura |
| 2002/0090141 A1 | 7/2002 | Kenyon et al. |
| 2003/0028509 A1 | 2/2003 | Sah |
| 2003/0233347 A1 | 12/2003 | Weinberg |
| 2004/0107189 A1 | 6/2004 | Burdick |
| 2007/0115151 A1 | 5/2007 | Singh |
| 2007/0257824 A1 | 11/2007 | Harada et al. |
| 2008/0071818 A1 | 3/2008 | Apanowicz |
| 2008/0189251 A1 | 8/2008 | Branscome et al. |
| 2008/0270496 A1 | 10/2008 | Lundvall |
| 2009/0006399 A1 | 1/2009 | Raman |
| 2009/0137701 A1 | 5/2009 | Hirabayashi |
| 2009/0157701 A1 | 6/2009 | Lahiri |
| 2009/0210467 A1 * | 8/2009 | Iorio ....................... H03M 7/24 708/204 |
| 2010/0124381 A1 | 5/2010 | Bossen |
| 2010/0153064 A1 | 6/2010 | Cormode et al. |
| 2010/0281079 A1 | 11/2010 | Marwah et al. |
| 2011/0099295 A1 | 4/2011 | Wegener |
| 2011/0145308 A1 | 6/2011 | Duale |
| 2011/0219357 A1 | 9/2011 | Livshits |
| 2012/0016901 A1 | 1/2012 | Agarwal et al. |
| 2012/0054225 A1 | 3/2012 | Marwah et al. |
| 2012/0089579 A1 | 4/2012 | Ranade et al. |
| 2012/0102056 A1 | 4/2012 | Guirard |
| 2012/0109981 A1 | 5/2012 | Graefe |
| 2012/0117076 A1 | 5/2012 | Austermann |
| 2012/0323929 A1 | 12/2012 | Kimura |
| 2013/0018889 A1 | 1/2013 | Jagmohan et al. |
| 2013/0036101 A1 | 2/2013 | Marwah |
| 2013/0086353 A1 | 4/2013 | Colgrove et al. |
| 2013/0099946 A1 | 4/2013 | Dickie et al. |
| 2013/0124467 A1 | 5/2013 | Naidu et al. |
| 2014/0114926 A1 | 4/2014 | Anderson |
| 2014/0114968 A1 | 4/2014 | Anderson |
| 2014/0258307 A1 | 9/2014 | West |
| 2015/0066900 A1 | 3/2015 | Schneider |
| 2015/0088830 A1 | 3/2015 | Kamp |
| 2015/0188563 A1 | 7/2015 | Dickie |
| 2015/0188564 A1 | 7/2015 | Dickie |
| 2015/0286465 A1 | 10/2015 | Dickie |
| 2015/0288381 A1 * | 10/2015 | Dickie .................... H03M 7/00 708/203 |
| 2016/0094242 A1 | 3/2016 | Ackerman et al. |
| 2016/0094243 A1 | 3/2016 | Ackerman et al. |
| 2016/0098420 A1 | 4/2016 | Dickie et al. |
| 2016/0098439 A1 | 4/2016 | Dickie et al. |
| 2016/0154831 A1 | 6/2016 | Dickie |
| 2016/0154835 A1 | 6/2016 | Dickie |
| 2016/0196278 A1 | 7/2016 | Ackerman et al. |
| 2016/0197622 A1 | 7/2016 | Ackerman et al. |
| 2016/0204797 A1 | 7/2016 | Ackerman et al. |
| 2016/0204798 A1 | 7/2016 | Ackerman et al. |
| 2016/0204799 A1 | 7/2016 | Ackerman et al. |
| 2016/0226512 A1 | 8/2016 | Dickie |
| 2016/0246810 A1 | 8/2016 | Ackerman et al. |
| 2016/0246811 A1 | 8/2016 | Ackerman et al. |
| 2016/0314055 A1 | 10/2016 | Bagchi |
| 2017/0154075 A1 | 6/2017 | Anderson |
| 2017/0315968 A1 | 11/2017 | Boucher |
| 2017/0315978 A1 | 11/2017 | Boucher |
| 2017/0315979 A1 | 11/2017 | Boucher |

FOREIGN PATENT DOCUMENTS

| | | |
|---|---|---|
| KR | 1020110053737 A | 5/2011 |
| WO | 2008034213 | 3/2008 |
| WO | 2009058650 | 5/2009 |
| WO | 2013096620 | 6/2013 |

OTHER PUBLICATIONS

Wikipedia.org, "Fundamental theorem of arithmetic", 2013, retrieved from https://en.wikipedia.org/w/index.php?title=Fundamental_theorem_of_arithmetic&oldid=574451066.

Baek, Seung Jun, et al; "Minimizing energy consumption in large-scale sensor networks through distributed data compression and hierarchical aggregation." Selected Areas in Communications, IEEE Journal on 22, No. 6 (2004): 1130-1140.

Yang, Dow-Yung, et al; "Compression of particle data from hierarchical approximate methods." ACM Transactions on Mathematical Software (TOMS) 27, No. 3 (2001): 317-339.

Wikepedia, "Charles Joseph Minard", Sep. 2014, 4 pages.

Friedman, "Data Visualization: Modern Approaches", Smashing Magazine, Aug. 2, 2007, 29 pages.

Wiegand, "Google Analytics Flow Analysis—Early Insights", Analytics Review, Jan. 15, 2013, 6 pages.

IBM, "Information as service from Server Explorer in Microsoft Visual Studio .Net", IP.com, IPCOM000139374D, Aug. 22, 2006, 5 pages.

Raman et al., "DB2 with BLU Acceleration: So Much More than Just a Column Store", VLDB Endowment, vol. 6, No. 11, Copyright 2013, VLDB Endowment 2150-8097/13/09, 12 pages.

Justin Zobel and Alistair Moffat, "Inverted Files for Text Search Engines". ACM Computing Surveys, vol. 38, No. 2, Article 6 (Jul. 2006). DOI=10.1145/11329561132959 http://doi.acm.org/10.1145/1132956.1132959.

Jordi Nin, Anne Laurent, and Pascal Poncelet, "Speed up gradual rule mining from stream datalA B-Tree and OWA-based approach". J. Intell. Inf. Syst. 35, Dec. 3, 2010, pp. 447-463. DOI=10.1007/s1084-4-009-0112-9 http://dx.doi.org/10.1007/s10844-009-0112-9.

J. M. Chambers, "Algorithm 410: Partial Sorting [M1]", CACM, vol. 14, Issue 5, May 1971, pp. 357-358.

William Pugh, "A Skip List Cookbook", UMIACS-TR-89-72.1, Jul. 1989, pp. 2-14.

Internet Society et al; "A Negative Acknowledgment Mechanism for Signaling Compression"; An IP.com Prior Art Database Technical Disclosure; http://ip.com/IPCOM/000125196D; May 24, 2005.

Tagliasacchi, M. et al; "Transform coder identification based on quantization footprints and lattice theory"; Department of Electronics and Information, Milano College, Milano Italy; Nov. 19, 2012.

(56) References Cited

OTHER PUBLICATIONS

Euclid, "Elements," Books 7 and 10, c. 300 BC; http://aleph0.clarku.edu/~djoyce/java/elements/toc.html.
"Capture and display of performance profile for dataflow graph", IPCOM000232481D, Nov. 11, 2013, 4 pages.
List of IBM Patents or Patent Applications Treated as Related, Jul. 19, 2016, 2 pages.
Microsoft, "Block-Based Floating Point Texture Compression", An IP.com Prior Art Database Technical Disclosure, http://ip.com/IPCOM/000167464D, Feb. 14, 2008. 9 pages.
IBM, "Practical Two-Cycle Forwarding Mechanism for Floating Point Units", An IP.com Prior Art Database Technical Disclosure, http://ip.com/IPCOM/000116162D, IBM Technical Disclosure Bulletin, vol. 38, No. 8, Aug. 1995, pp. 225-236.
Pool et al., "Lossless Compression of Variable-Precision Floating-Point Buffers on GPUs", ACM, copyright 2011, pp. 1-8.
Isenburg et al., "Lossless Compression of Floating-Point Geometry", copyright CAD Solutions Co., Ltd., CAD'04 Conference, 2004, pp. 1-7.
Steele JR. et al., "How to Print Floating-Point Numbers Accurately", Proceedings of the ACM SIGPLAN'90 Conference, White Plains, NY, Jun. 1990, ACM 0-89791-364-7/90/0006/0112, pp. 112-126.
Loitsch, Florian, "Printing Floating-Point Numbers Quickly and Accurately with Integers", PLDI'10, Toronto, Ontario, Canada, Jun. 2010, ACM 978-1-4503-0019/10/06, 11 pages.
Isenburg et al., "Lossless Compression of Predicted Floating-Point Values", http://www.cs.unc.edu/~isenburg/lcpfpv/, accessed May 2013, 2 pages.
Isenburg et al., "Lossless Compression of Predicted Floating-Point Geometry", Jul. 10, 2004, pp. 1-13.
Lindstrom et al., "Fast and Efficient Compression of Floating-Point Data", IEEE Transactions on Visualization and Computer Graphics, vol. 12, No. 5, Sep./Oct. 2006, 6 pages.

\* cited by examiner

COMPRESSION OF FLOATING-POINT DATA BY IDENTIFYING A PREVIOUS LOSS OF PRECISION

CROSS-REFERENCE TO RELATED APPLICATIONS

This application is a continuation of U.S. patent application Ser. No. 14/246,725, entitled "COMPRESSION OF FLOATING-POINT DATA BY IDENTIFYING A PREVIOUS LOSS OF PRECISION" and filed Apr. 7, 2014, the disclosure of which is incorporated herein by reference in its entirety.

BACKGROUND

1. Technical Field

Present invention embodiments relate to compressing floating-point data, and more specifically, to compressing binary floating-point data based on a previous loss of precision incurred during capture or processing of that floating-point data.

2. Discussion of the Related Art

Storing large amounts of data for live data retrieval can he expensive due to the amount of storage and processing hardware required and maintained, and the electrical power required to operate that hardware (e.g., in datacenter operations). To reduce storage, bandwidth, and computational requirements, data compression techniques are employed. Data is compressed prior to storage and decompressed when an application or user retrieves the data. Data compression techniques may be lossless or lossy. Lossful techniques may he used when it is acceptable to lose some data precision relative to the original source data. For example, a photo presented by way of a low resolution system (e.g., a cell phone display) may not need all of the detail provided by the higher resolution source photo (e.g., a high-resolution family portrait). The cell phone essentially displays the substance of the higher resolution family portrait, but with the reduced processing and storage requirements available by using the lower resolution image (i.e., data that are imperceptible to the viewer may be discarded).

Lossless techniques for compressing data may be used when a loss of data would be detrimental (e.g., a loss of a bank account digit, a loss of social security number, or loss of data for mission critical systems such as emergency response systems). In other examples, systems that use floating-point data such as results of medical or seismic studies, those systems may not have knowledge of how the resulting data may be used, or the kind of internal structure or relationships between values that may exist, e.g., variable correlation. In such systems, it may not be known what information is relevant, and what information is irrelevant, and therefore, may he discarded as an acceptable lossy result.

Depending on system requirements, compression of all data fields may be attained down to their intrinsic entropy. For integer data, a significant amount of compression can be found by eliding high-precision bits in small-magnitude values, or in the value differences among values. In character data, useful compression may be achieved by eliding trailing spaces or by using predictive coding. However, for floating-point data types, very little compression can be achieved when using integer or character data compression techniques, and predictive coding depends on information, which is not known to the system, namely the relationships between individual values.

BRIEF SUMMARY

According to one embodiment of the present invention, a computer-implemented method of compressing floating-point data is described. Each binary floating-point value in a set of binary floating-point values is converted to a decimal floating-point value. Data are determined including the exponent, the mantissa and a quantity of decimal digits of the mantissa for each decimal floating-point value. The exponents, the mantissas and the quantity of decimal digits are individually compressed to produce compressed floating-point values based on the individual compressions. Embodiments of the present invention further include a system and computer program product for compressing floating-point data in substantially the same manner described above.

BRIEF DESCRIPTION OF THE SEVERAL VIEWS OF THE DRAWINGS

Generally, like reference numerals in the various figures are utilized to designate like components.

DETAILED DESCRIPTION

Figure 1:
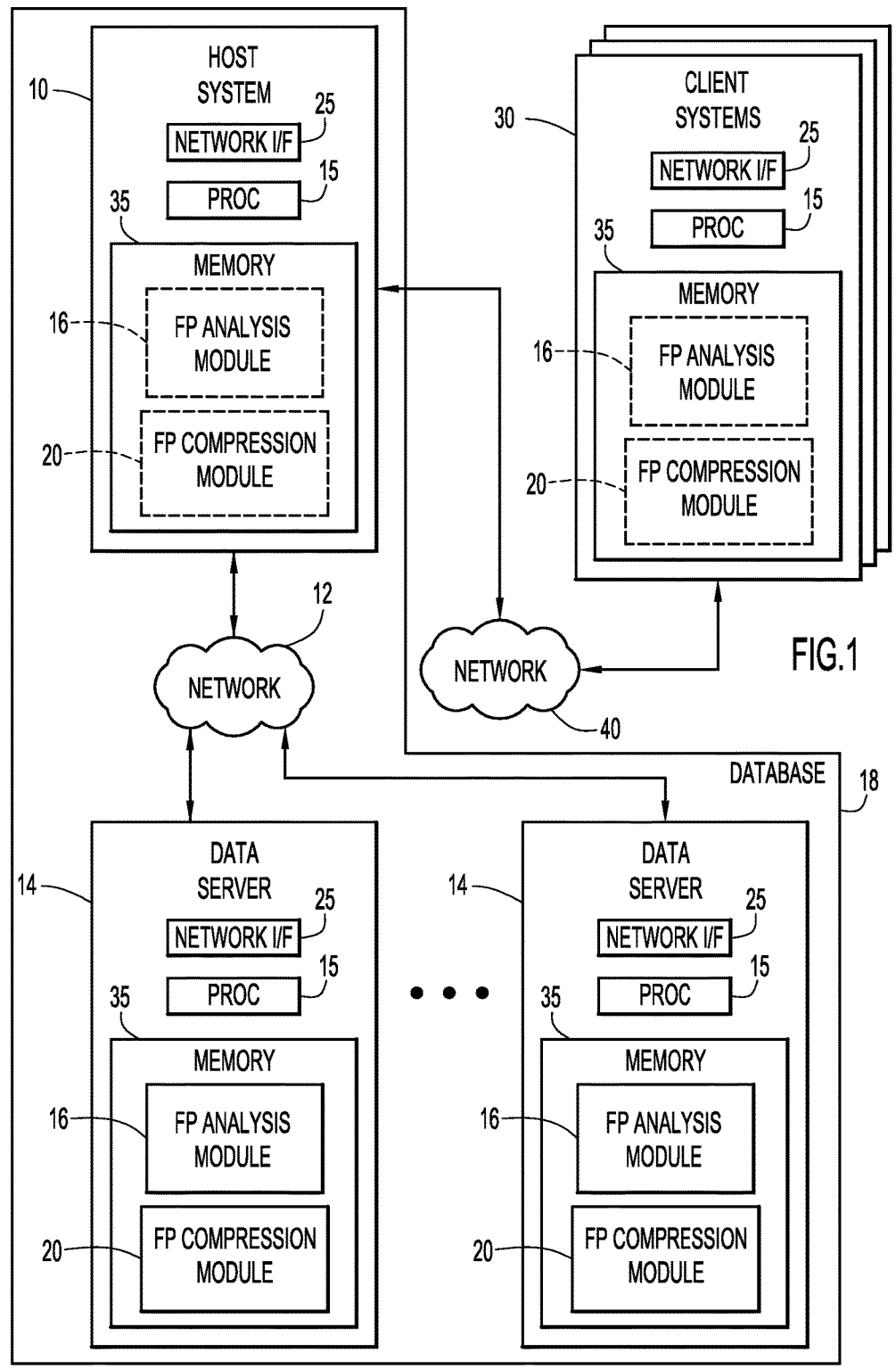
FIG. 1 is a diagrammatic illustration of an example computing environment for use with an embodiment of the present invention.

Present invention embodiments optimize lossless floating-point compression for storage in a database by compressing components of a series of binary floating-point values (e.g., for rows in a database table). Compression efficiencies may he optimized or improved by way of the techniques described herein by choosing a representation for the floating-point values such that the representation has similar characteristics. For example, characteristics such that the represented floating-point values have the same precision or a similar number of significant digits when trailing zeroes are not considered significant (e.g., 0.1 is not as precise as 0.10). In a simplified example, floating-point values with a precision in tenths of a unit (e.g., x.1, y.2, etc.) may be aggregated for compression, where x and y are integers of like range such that the same number of decimal digits may be used to represent both x.1 and y.2.

Floating-point numbers may be defined for a variety of digital formats (i.e., formats that rely on ones and zeros (binary) for their representation on a computer or for storage in a memory device). Floating-point numbers represent a small subset of the real numbers, along with infinities and exceptional values that cannot always be represented with finite precision. For example, representation of real numbers that have an infinite level of precision such as the mathematical constants Pi ($\pi$) or Elder's number (e) must be represented or used on a computer in a truncated form (2.78 or 3.1416) in order to have a practical level of precision that may be processed on a given computer architecture. This precept is generally true since real numbers, in a form that may use infinite precision, may be either unknown or impractical to implement on existing processors.

Accordingly, the techniques presented herein apply to floating-point representations of real numbers that have a finite precision (i.e., finite floating-point numbers that can be represented with a fixed number of digits). A finite floating-point value in any radix or base can be expressed as:

$$(-1)^s \times c \times b^q \qquad (\text{Eq. 1})$$

where s is a sign bit in which a value of one indicates a negative value, c is the mantissa, b is the base (e.g., 2, 10, 16, etc.), and q is the signed exponent.

The most common representations use base b=2. Formats with base-2 are standardized as Institute of Electrical and Electronics Engineers (IEEE) 754 format, e.g., binary32 and binary64, and are supported by fast hardware in modern computers.

In contrast, floating-point values in base-10 (b=10) are easier for humans to work with. Floating-point base-10 is also supported by IEEE 754. In one example, scientific notation can be considered a floating-point representation with base-10. The set of real numbers representable in base-2 floating-point and the set of real numbers representable in base-10 floating-point overlap, but are mostly disjoint from each other. Therefore, the operation of converting a floating-point number from one base to another is not as simple as finding an exact representation, which in many cases simply does not exist. Instead, conversion includes finding a floating-point number in the new base that is the closest representation of the floating-point number in the original base (i.e., a floating-point number in the new base that is nearest to the number represented in the old base). The conversion is a non-deterministic process in that there may be multiple output values from the conversion with each output including a different number of digits or different digits in the least significant bit positions, such that all of the outputs are all close to the input value (in the old base).

Accordingly, whenever there is conversion from one floating-point number formatbase to another formatbase, there is a potential loss of precision. In this regard, modern computers do not have the option to perform computations in base-10, and instead use a binary numbering system in which the 0 and 1 digits correspond to any given transistor or computing element being "on" or "off." Accordingly, in the computing realm, floating-point numbers are stored as a series of ones and zeroes in a predetermined format. To illustrate, the number 1.1 in base-10 is equal to 1.1 (i.e., $1 \times 10^0 + 1 \times 10^{-1}$). In base-2, 1.1 binary (B) is equal to $1 \times 2^0 + 1 \times 2^{-1}$ (1+0.5), or 1.5 in base-10. However, to convert 1.1 base-10 to base-2 requires a determination of a desired level of precision and an iterative conversion.

For example, if there are five bits of precision available in a given binary format, then one representation of 1.1 base-10 using five bits is 1,0001B (i.e., $1 \times 2^0 + 0 \times 2^{-1} + 0 \times 2^{-2} + 0 \times 2^{-3} + 1 \times 2^{-4}$) or 1.0625 base-10. This value understates the 1.1 base-10 value by a difference of 0.0375 (i.e., 1.1−1.0625). The loss due to conversion of 0.0375 can be reduced by increasing the number of bits available for the binary representation. Thus, if six bits were available for representation in base-2, a closer base-2 representation may be 1.00011B, which adds precision by way of the one additional bit. When expanded, 1.00011B yields (i.e., $1 \times 2^0 + 0 \times 2^{-1} + 0 \times 2^{-2} + 0 \times 2^{-3} + 1 \times 2^{-4} + 1 \times 2^{-5}$) or 1.095 base-10, which reduces the five bit error of 0.0375 to a six bit error component of 0.005 (i.e., 1.1−1.095). Accordingly, if only five bits were available for processing and storage, the best approximation of 1.1 may be 1.0625 in a five-bit system.

Thus, due to the physical constraints (e.g., processing word length such as 32-bit, 64-bit, etc.) of any given microprocessor, there will always be a shortage of bits when attempting to maximizing precision with respect to a given value, or when converting from one base or format to another (e.g., binary floating-point to decimal floating-point or vice versa). In other words and by way of example, when a value is converted from binary floating-point to a base-10 floating-point for use by a human, some information or precision with respect to the original base-2 value may be lost. If the base-2 value is subsequently stored as a base-10 value, then that information may be permanently lost.

Systemic loss of precision may be further induced by the host system itself or the human operator. For example, the value Pi ($\pi$) can consume an infinite number of digits of precision. However, when used for a practical application, Pi ($\pi$) may be stored in memory using a limited number of digits (e.g., as 3.14, 3.1416, 3.1415926, etc.), depending on a desired level of computational accuracy when using the constant Pi ($\pi$). The same may be said of floating-point numbers entered by a human data entry operator that limits the precision of the underlying data, or a system that monitors physical parameters (e.g. outside air temperature).

In banking systems, interest rate calculations may result in interest of millionths of a dollar, yet banking systems typically operate using dollars and cents (i.e., hundredths of a dollar), and as such, interest rate calculations may be rounded off to the nearest penny. In banking, temperature monitoring, or other systems that use limited precision floating-point numbers, the values in use may not actually use the full level of precision that is available in any given floating-point format, and may take advantage of this property as further described hereinafter. For example, an account balance of $1.22 may actually have a value of 1.220000 when stored using an IEEE 754 single precision float. In the example, the trailing four zeroes do not provide any additional information and the value of 1.22 may be stored using, e.g., 11 bits as opposed to 32 bits according to Eq. 1 (e.g., one sign bit (s), seven mantissa bits (c) and three exponent bits (q)).

According to the techniques described herein, conversion from one base or format to another is made while using the fewest possible number of digits (e.g., in the output of the non-negative integer coefficient (c) or mantissa). In order to minimize a given number of digits other optimizations may be used, whether or not those digits are used for the non negative integer coefficient (c), the positive integer base (b), or the signed exponent (q) (e.g., c, b, and or q may be normalized under circumstances described below). Consider a new base-10 value for presentation to a user that may be converted from an original base-2 value, the new base-10 floating-point number should be that value nearest to the original base-2 floating-point number used as an input to the conversion. Of all of the possible base-10 floating-point numbers with this property, the base-10 value with the smallest coefficient (c) is a desired starting point for the techniques described herein and as further described in connection with FIG. 2.

This conversion differs from other possible conversions that may be obtained. For example, during conversion, a base-10 floating-point number which is closest to the original base-2 number may have a constraint based on the maximum number of digits (as opposed to a minimum number of digits), or may have a constraint with a fixed number of digits which results in the closest base-10 number with the fixed number of digits (but which might actually be closer to a different base-2 number due to the lack of enough digits of precision), or a constraint that guarantees precision regardless of conversion or re-conversion, Given the volumes of data in any given system and that the upstream data was once expressed in base-10 according to fixed number of digits (or the upstream data originated in base-10), the original base-10 data would typically be stored with fewer digits than would be required in a lossless conversion between data bases and/or formats. Thus, in order to take advantage of data that may have been stored with a greater level of precision than was necessary, the techniques described may attempt to restore the original base-10 format, which originally used fewer digits, and then encode or re-encode the data using a fewest possible number of digits.

However, since the original data might not have been uniformly expressed with the fewest possible number of digits, it may be beneficial to add additional digits (e.g. to the coefficient (c) or the exponent (q)). In one example, since the original data might not have included fully normalized exponents, the exponents may be perturbed or otherwise normalized. Thus, the coefficient (c) or the exponent (q) may be optimized according to the techniques described herein. These optimizations are further described hereinafter.

An example environment for use with present invention embodiments is illustrated in FIG. 1. Specifically, the environment includes one or more server or host systems 10, and one or more data servers 14. Host systems 10 and data servers 14 may be remote from each other and communicate over a network 12. The network may be implemented by any number of any suitable communications media (e.g., wide area network (WAN), local area network (LAN), Internet, intranet, etc.). Alternatively, host systems 10 and data servers 14 may be local to each other, and communicate via any appropriate local communication medium (e.g., local area network (LAN), data center network, hardwire, wireless link, intranet, etc.). One or more clients or end user systems 30 may be coupled to host systems 10 via a network (e.g., network 12 or network 40 depending on system configuration), data center network or data center edge switch.

Host systems 10, data servers 14, and client systems 30 may be implemented by any conventional or other computer systems preferably equipped with a display or monitor (not shown), a base (e.g., including at least one processor 15, one or more memories 35 and/or internal or external network interfaces or communications devices 25 (e.g., modem, network cards, etc.)), optional input devices (e.g., a keyboard, mouse or other input device), and any commercially available and custom software (e.g., server/communications software, floating-point analysis module, floating-point compression module, browser/interface software, etc.). Data servers 14 may comprise compute and storage nodes or database engine blades (e.g., in a datacenter or server film).

Data servers 14 may receive floating-point data (e.g., weather data, blood test results, or any other data that may use a precision greater than that provided by integer data) for compression and storage. The floating-point data may be stored in database tables with records delineated by rows, and data of a similar type and format provided by way of table columns received from host systems 10. In another example, floating-point data may be received by the data servers, either directly or indirectly (e.g., from a client system). The data servers 14 may include a floating-point analysis module 16 to analyze and normalize floating-point data, and a floating-point compression module 20 to compress data for efficient storage.

One or more components of the host systems 10, network 12 and data servers 14 may comprise a database management system (DBMS) or database 18. The database system 18 may use any conventional or other database, or storage unit. Other DBMS components may be local to or remote from host systems 10 and data servers 14, and may communicate via any appropriate communication medium such as network 12 or network 40 (e.g., local area network (LAN), wide area network (WAN), Internet, hardwire, wireless link, intranet, etc.). Any clients, hosts, or data servers may present a graphical user interface (e.g., GUI, etc.) or other interface (e.g., command line prompts, menu screens, etc) to solicit information from users pertaining to data compression and storage, and to provide results (e.g., database identification, compression statistics, etc.). Further, these systems may provide reports to the user via the display or a printer, or may send the results or reports to another device/system for presenting to the user.

Alternatively, one or more hosts 10 or clients 30 may perform floating-point data analysis and compression when operating as a stand-alone unit (i.e., without using data servers 14). In a stand-alone mode of operation, the host/client stores or has access to the data (e.g., floating-point data, databases, etc), and includes floating-point analysis module 16 to analyze and separate floating-point data components, and floating-point compression module 20 to compress floating-point data components. The graphical user interface (e.g., GUI, etc.) or other interface (e.g., command line prompts, menu screens, etc.) solicits information from a corresponding user pertaining to compressing floating-point data, and may provide reports including compression efficiency results (e.g., compression statistics, etc.).

Floating-point analysis module 16 and floating-point compression module 20 may include one or more modules or units to perform the various functions of present invention embodiments described below. The various modules (e.g., floating-point analysis module, floating-point compression module, etc.) may be implemented by any combination of any quantity of software and/or hardware modules or units, and may reside within memory 35 of the host systems, client systems and/or data servers for execution by processor 15. It should be understood, that the computing environment depicted in FIG. 1 provides example platforms (e.g., host systems 10, backend or data servers 14) for illustrating the techniques described herein. In this regard, floating-point data and database storage on one data server 14 may have no relationship with floating-point data and database storage on another data server 14.

Figure 2:
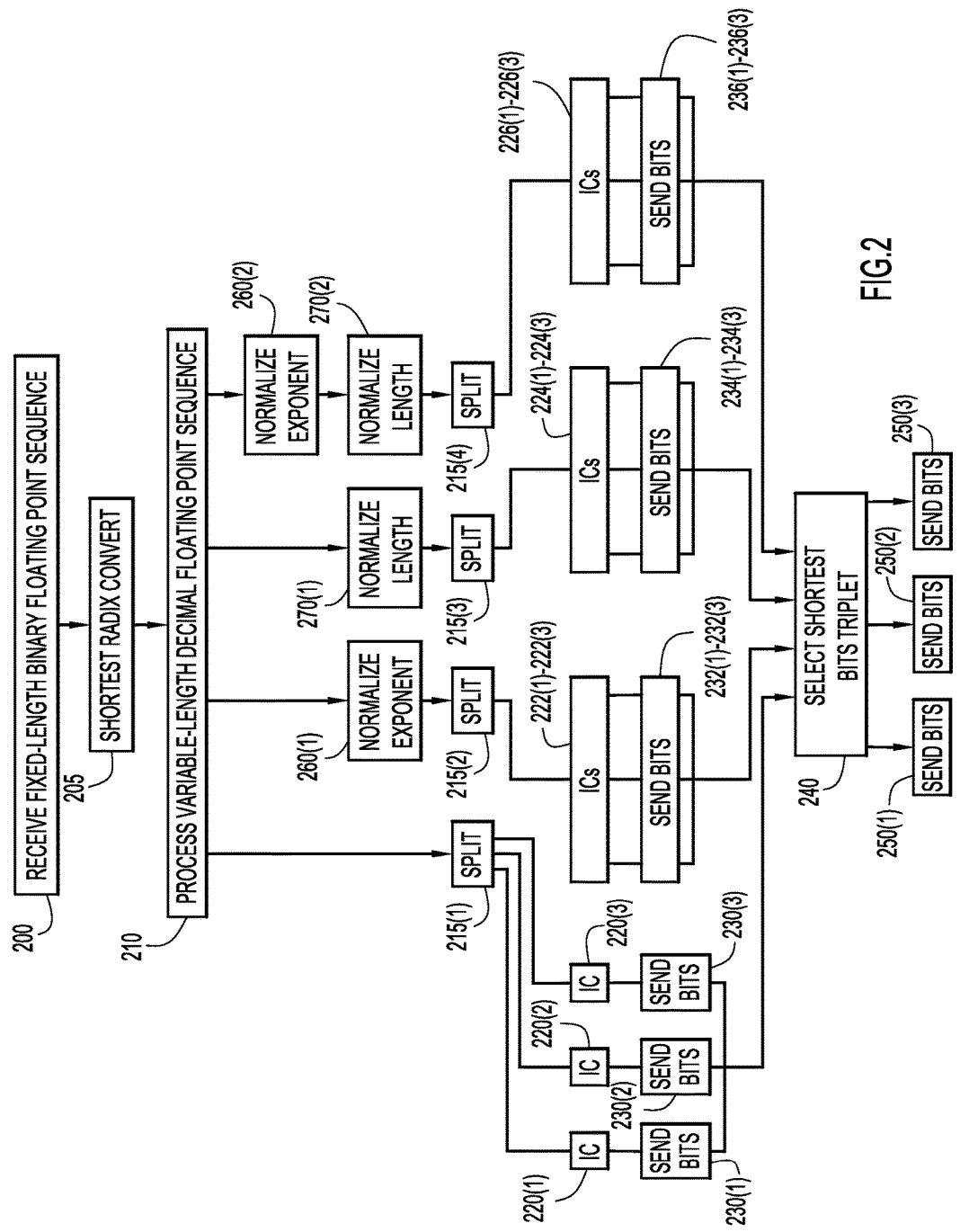
FIG. 2 is a flow diagram illustrating a manner in which floating-point data are compressed according to an embodiment of the present invention.

A manner in which floating-point analysis module 16 and floating-point compression module 20 (e.g., via a host system 10, client systems 30 and/or data servers 14) compresses floating-point data for database storage according to an embodiment of the present invention is illustrated in FIG. 2. Specifically, fixed-length binary floating-point data are received or retrieved at step 200. The floating-point data may be in the form IEEE 754 binary floating-point data, not compressed, and may include a specific level of precision such as single precision, double precision, etc., which corresponds to a number of binary bits that represent the binary floating-point data (e.g., 32-bit single precision, 64-bit double precision, etc.).

Typically, decimal floating-point data (e.g., 123.5, 3.14, etc.) are displayed and used by individuals in decimal format (i.e., radix 10 or base-10) such as when viewing banking data or scientific data. When converted to a floating-point format that can be used by a computer for processing and storage, the data are in a format that can be universally employed or converted such as floating-point data defined by IEEE 754. Floating-point data in IEEE 754 format include a sign bit, a significand or mantissa, and an exponent value, as described with respect to Eq. 1 above. The sign bit indicates whether the floating-point value is positive or negative. The mantissa represents the equivalent of the numerical digits in the floating-point value (e.g., 1235 or 314 as found in 123.5. 3.14) but in binary, while the exponent indicates a base-2 power. The sign bit, mantissa, and base-exponent are multiplied to approximately reproduce the original base-10 floating-point value.

For example, a value of −23.456 (base-10) can be represented by s=1 (negative), c=23456, b=10 and q=−3 such that −1×23456×10$^{-3}$=−23.456 according to Eq. 1. In binary floating-point (e.g., base-2) b is equal to two in Eq. 1. The IEEE 754 binary format assigns a given number of bits to each of the mantissa and the exponent. For example, in 32-bit single precision IEEE 754, the most significant bit is the sign bit followed by an 8-bit signed exponent, and a 23-bit significand (mantissa or fraction). IEEE 754 64-bit double precision values use a sign bit, an 11-bit exponent, and a 52-bit significand. IEEE 754 single and double precision floating-point data provide approximately 7 and 15 base-10 digits of precision, respectively, when converted to and from base-10. As described above, when 7 or 15 base-10 digits of precision are not needed, the techniques described herein can provide additional compression efficiencies.

After the binary floating-point values are received at step 200, the binary floating-point values are converted to radix 10 using a shortest radix conversion process at step 205. Conversion from the binary to base-10 may be had by way of a floating-point printing function (e.g., the C programming language printf ( ) function) that can output American Standard Code for Information Interchange (ASCII) characters for the decimal equivalents of the binary floating-point data. For example, a database entry may have a value of 0.3 as entered by a data entry operator. When converted to single precision binary floating-point fur storage, 0.3 may be stored as 0.2999999 with seven digits of precision due to the limits of 32 bit binary resolution. When converted back to a decimal representation it is desirable and more compact to print 0.3 rather than 0.2999999 that is the best resolution available in single precision binary floating-point.

The accuracy of the printf ( ) function and others like it has improved over time. For example, in a seminal paper, Steele and White (Guy L, Steele and Jon L. White, How to Print Floating-Point Numbers Accurately, ACM SIGPLAN '90 Conference on Programming Language Design and Implementation, White Plains, N.Y., Jun. 20-22, 1990) describe techniques for printing floating-point number to ASCII, while Loitsch (Florian Loitsch, Printing Floating-Point Numbers Quickly and Accurately with Integers, ACM PLDI '10, Toronto, Calif., Jun. 5-10, 2010) describes improvements to various areas of the Steele and White algorithm, among others. Shortest radix conversion process 205 converts or formats the values in the floating-point sequence to decimal floating-point according to existing algorithms (e.g., Steele and White, printf ( ) functions, etc.). Process 205 converts the binary floating-point values to decimal values that comprise a minimum number of decimal digits to represent the floating-point input values. Thus, the minimum number of decimal digits does not include trailing zeros. Although advantages may be obtained through a shortest radix conversion process (e.g., as employed by the Steele and White algorithm), the techniques described herein may be applied in connection with any radix conversion algorithm.

Data inserted into a database often arrives in an ASCII format, and is parsed for insertion. The source of that ASCII data may have some knowledge of the actual precision of the data, which is reflected in the ASCII formatting chosen. The data source may be sloppy and generated with the default C printf ( ) formatting. Both of these approaches may lose some precision. For example, floating-point data may be captured from a sensor, and then printed with 3 digits of precision regardless of the available sensor precision. The database insertion process parses ASCII data and produces binary float or double values (i.e., 32 or 64 bits of precision). At some point farther down the data pipeline processing stream, the binary float or double values are compressed. According to the techniques described herein, the compressor determines that the sensor data use only 3 digits of precision in base-10 (i.e., the decimal values of 0-999). In a binary representation, this can be represented using 10 bits (i.e., $2^{10}$ can represent decimal values of 0-1023), which uses less storage space than 32 or 64 bits.

For example, the values 12.0, 1.2 and 0.12 all have a length of two decimal digits, 1 and 2 (12), but with different decimal exponents such as 0, −1 and −2, respectively (e.g., 0.12 is equal to $12 \times 10^{-2}$). In other words, one difference between these examples values lies in the exponent used to represent the given value. In another example, values may have three decimal digits such as 125.0, 12.5 or 0.125. Thus, after the shortest radix conversion at step 205, a variable-length floating-point sequence may be produced comprising a plurality of decimal digits of differing length (e.g., two digits, three digits, etc.) at step 210. The output at step 205 may include three separate variables forming a triplet comprising: 1) the significant decimal digits themselves, 2) a count of the number of decimal digits (e.g., 2, 3, 4, etc.), and 3) the base-10 exponent of the base-10 value. Thus, a value with the decimal base digits 12 has the digits 1 and 2, a decimal digit count of two, and may have base-10 exponents such as 0, −1 and −2 to indicate value of 12, 1.2 and 0.12, respectively. In sum, the triplet includes the minimum number of significant digits, the significant digit count and corresponding exponent value according to the techniques presented herein.

Given that a variety of floating-point data may be present in the sequence received at step 200, it may be beneficial for case of illustration to describe base-10 floating-point values as normalized values with a zero preceding the decimal point and adjust the exponent accordingly. For example, the values 12.0, 1.2 and 0.12 have 12 as their significant digits with a digit count of two and when converted to a format with a zero in front of the decimal point yields values of $0.12 \times 10^2$, $0.12 \times 10^1$, and $0.12 \times 10^0$, respectively. Thus a series of triplets may be represented by {decimal digits, decimal count, decimal exponent} such that $0.12 \times 10^2$, $0.12 \times 10^1$, and $0.12 \times 10^0$ may be represented as {12, 2, 2}, {12, 2, 1} and {12, 2, 0}, respectively. The order of the values in the triplet is not of concern as long as the order is consistent among triplets.

When floating-point data have similar characteristics, such as similar counts and exponents, the compressor can take advantage of those characteristics to increase compression efficiency. By way of example, a sample of the sensor data with three digits of precision may include the values 0.928, 0.183, 0.910, 0.283, . . . These values can be represented as $10^{-3} \times [928, 183, 910, 283, \ldots]$, with a count of three digits, an exponent of −3 and digits (mantissa). The count, exponent and mantissa can be compressed individually. The compressed values can be decompressed to obtain the original data (i.e., the compression is lossless).

The variable-length floating-point sequence is processed at step 210. Values in a data triplet may be concatenated for efficient storage. Several independent processing options or branches may be performed, of which four examples are shown in FIG. 2. Each of the four example processing options terminate at a corresponding split function 215(1)-215(4), were some processing branches include intermediate processing modules to normalize exponents, mantissa lengths, or both. Normalization of one or more of the decimal components may provide advantageous integer compression efficiencies. in a first of the processing options, variable-length floating-point sequence is sent directly to split function for splitting a previously concatenated triplet at step 215(1). The split function separates a concatenated variable-length floating-point sequence into the corresponding count, mantissa and exponent, The individual values split at step 215(1) that include the count, mantissa and exponent are sent to respective integer compressors (IC) 220(1), 220(2) and 220(3). For example, count data may be sent to IC 220(1), mantissa data may be sent to IC 220(2), and exponent data may be sent to IC 220(3). Each of ICs 220(1), 220(2) and 220(3) perform integer compression in essentially the same manner, and are further described in connection with FIG. 3 (e.g., as performed by floating-point compression module 20). Integer compression may use any of a variety of known integer compression techniques described later. As referred to herein, plural units or modules may be referred to at a lesser level of granularity. For example, ICs 220(1), 220(2) and 220(3) may be collectively referred to as ICs 220.

Each of the ICs shown of FIG. 2 generates a stream of bits that represent corresponding compressed integers. Once generated, the streams of bits from ICs 220(1), 220(2) and 220(3) are sent at steps 230(1), 230(2) and 230(3), respectively. In other words, bits sent at step 230(1) may comprise a compressed count, bits sent at step 230(2) may comprise a compressed mantissa and bits sent at step 230(3) may comprise a compressed. exponent. Bits sent at steps 230(1), 230(2) and 230(3) may be concatenated to produce a compressed triplet in a similar manner as described above, and sent to a select shortest bits triplet for selection at step 240. Bits sent at steps 230. 232, 234 and 236 may be referred to as candidate bit streams since only a single bit stream is selected for recording or storage at step 240.

Before describing the remaining three processing branch examples, it should be noted that the operation of other split functions 215 (i.e., 215(2)(4)) and ICs 222, 224, and 226 may operate in a similar or duplicate manner with regard to splitting and compressing data triplets as split function 215(1) and ICs 220. For example, split functions 215(2)-(4) operate in a similar manner as split function 215(1). ICs 222 comprise ICs 222(1), 222(2) and 222(3) in the same manner as ICs 220. Bits sent at step 232 include bits sent at steps 232(1), 232(2) and 232(3), and so on, such that four parallel processing structures are operational, one for each processing branch for processing variable-length floating-point sequences provided at step 210.

In a second example processing sequence, exponents are normalized at step 260(1). Exponents for each decimal floating-point value are normalized by increasing its exponent to match the highest exponent in a given floating-point sequence and compensates for increasing the exponent by simultaneously modifying the mantissa by adding leading zeros. Normalizing the exponent produces homogeneous or like valued exponents across the data set. The decimal floating-point values with a constant exponent are then processed as previously described through a split module 215(2) and IC modules 222. After compression and concatenation, a second candidate bit stream is sent at step 232.

The floating-point sequence is processed a third time by normalizing the length of the mantissa at step 270(1) by adding trailing zeros to each mantissa until the mantissa values all have the same number of digits (i.e., the mantissas are like sized across the data set). The data are then processed as previously described through split module 215(3), IC modules 224, and concatenated to produce a third candidate bit stream for sending at step 234.

The floating-point sequence is processed a fourth time by normalizing the exponent at step 260(2) which normalizes the exponent in the same manner described above for step 260(1). The floating-point sequence is further processed by normalizing the mantissa length at step 270(2), which normalizes the mantissa length in the same manner described above for step 270(1). Data are then processed as previously described through split module 215(4), IC modules 226, and concatenated to produce a fourth candidate bit stream for sending at step 236.

Finally, four candidate bit streams sent at steps 230-236 are compared at step 240 and the triplet from among the triplets from steps 230-236 with the shortest (least) bit sequence is selected to produce bits 250(1), 250(2) and 250(3), which represent the decimal count, decimal mantissa, and decimal exponent in compressed form for storage or other processing. Any of the steps, units or modules depicted in FIG. 2 may be implemented in software, hardware or a combination of both hardware and software. In a software implementation, like functions or operations may be the same software module called each time functions of a particular module are needed. In a hardware implementation, like functions may be time-multiplexed as in software, or could be separate physical instantiations of the same module.

To further illustrate the concepts described herein, consider an example data set comprising the values of {0.103, 0.394, 0.082 and 0.750}.Shortest radix conversion at step 205 may generate variable-length floating-point values with one decimal value preceding the decimal point and with an exponent that is adjusted accordingly. For example, after conversion at step 205 the variable-length floating-point values in the data set may be represented as $1.03 \times 10^{-1}$, $3.94 \times 10^{-1}$, $8.2 \times 10^{-2}$ and $7.5 \times 10^{-1}$. These values are copied for processing into four streams for separate processing at step 210 as described above.

The first stream comprises raw {exponent, digit count, mantissa} data triplets with values of {−1, 3, 103}, {−1, 3, 394}, {−2, 2, 82} and {−1, 2, 75} and after the triplets are split (e.g., at 215(1)) the respective exponent, count, and mantissa values for the set are {−1, −1, −2, −1}, {3, 3, 2, 2} and {103, 394, 82, 75}. The second stream comprises data that has been exponent normalized (e.g., at 260(1)) to generate data comprising a like exponent. Accordingly, after exponent normalization the floating-point values may be represented as $1.03 \times 10^{-1}$, $3.94 \times 10^{-1}$, $0.82 \times 10^{-1}$ and $7.5 \times 10^{-1}$ with triplets of {−1, 3, 103}, {−1, 3, 394}, {−1, 3, 082} and {−1, 2, 75}. After the triplets are split (e.g., at step 215(2)), the respective exponent, count, and mantissa values for the set are {−1, −1, −1, −1}, {3, 3, 3, 2} and {103, 394, 082, 75}, respectively.

The third stream comprises data that has been length normalized (e.g., at 270(1)) to generate data comprising a like mantissa length. Accordingly, after length normalization the floating-point values may be represented as $1.03 \times 10^{-1}$, $3.94 \times 10^{-1}$, $8.20 \times 10^{-2}$ and $7.5 \times 10^{-1}$ with triplets of {−1, 3, 103}, {−1, 3, 394}, {−2, 3, 820} and {−1, 3, 750}. After the triplets are split (e.g., at step 215(3)), the respective exponent, count, and mantissa values for the set are $\{-1, -1, -2, -1\}$, $\{3, 3, 3, 3\}$ and $\{103, 394, 820, 750\}$, respectively. The fourth stream comprises data that has been exponent normalized (e.g., by at step 260(2)) and length normalized (e.g., by at step 270(2)) to generate data comprising a like exponent length and mantissa length. Accordingly, after exponent and length normalization the floating-point values may be represented as $1.03 \times 10^{-1}$, $3.94 \times 10^{-1}$, $0.82 \times 10^{-1}$ and $7.5 \times 10^{-1}$ with triplets of $\{-1, 3, 103\}$, $\{-1, 3, 394\}$, $\{-1, 3, 82\}$ and $\{-1, 3, 750\}$. After the triplets are split (e.g., at step 215(4)), the respective exponent, count, and mantissa values for the set are $\{-1, -1, -1, -1\}$, $\{3, 3, 3, 3\}$ and $\{103, 394, 82, 750\}$, respectively.

Each of the sets of triplets is compressed and sent to select shortest hits triplet module 240. From the four candidate bit streams from steps 230-236, the shortest bit stream is selected as output of the compression algorithm at step 250. For example, consider the third floating-point number, $8.2 \times 10^{-2}$, in the set which when processed by the four processing pathways produces respective triplets of $\{-2, 2, 82\}$, $\{-1, 3, 082\}$, $\{-2, 3, 820\}$, and $\{-1, 3, 82\}$ as discussed above. These triplets are part of the sets of triplets which are compressed and provided to module 240 that selects the shortest compressed set of triplets from among the four versions for output at step 250.

Figure 3:
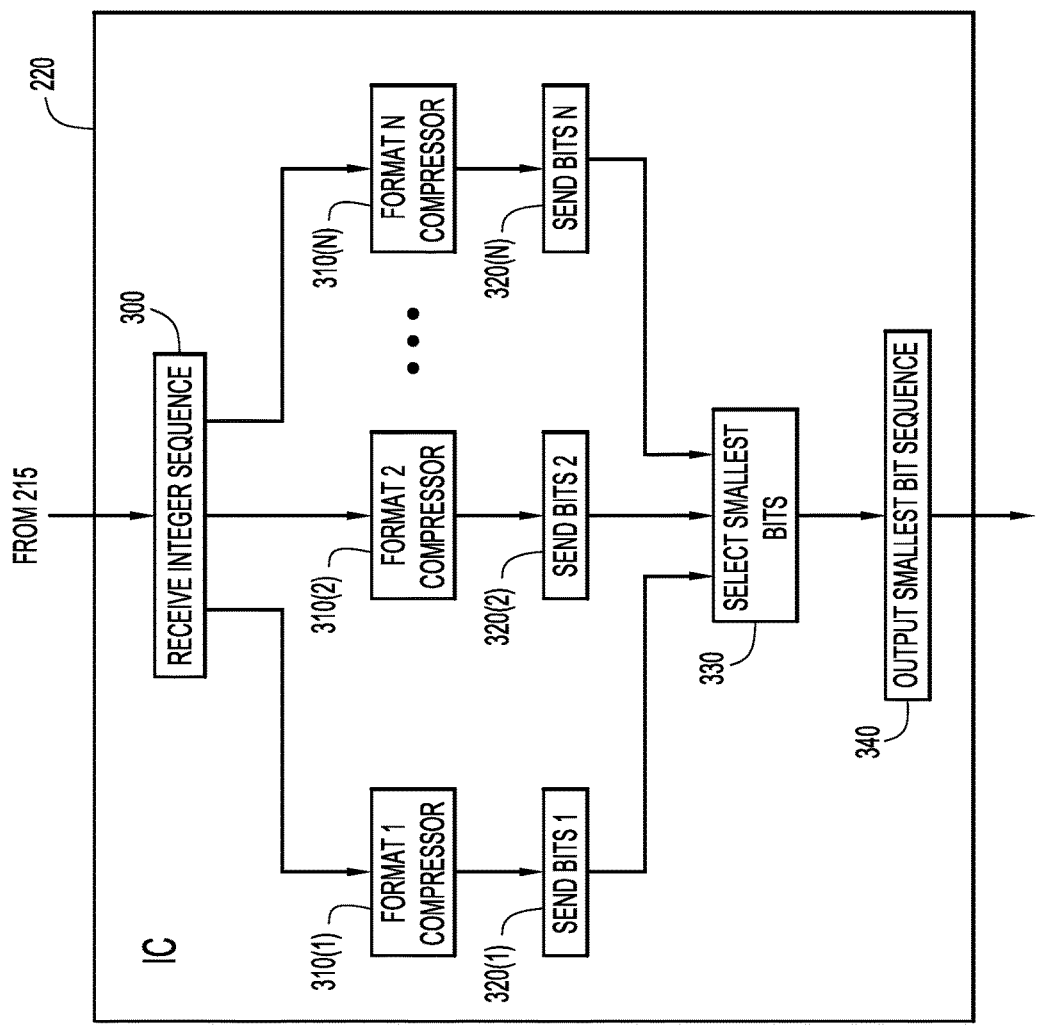
FIG. 3 is a flow diagram illustrating additional implementation details for an integer compressor shown in FIG. 2 for compressing integer components of the floating-point data according to an embodiment of the present invention.

Referring now to FIG. 3, a procedural flow chart illustrates additional implementation details for one of IC modules 220 as depicted in FIG. 2 for compressing floating-point data according to an embodiment of the present invention (e.g., by floating-point compression module 20). Each of ICs 220 receives an integer sequence or data from one branch of a split functions at step 215 (e.g., one of the decimal count, the decimal exponent or the decimal mantissa). The integer sequence is received at step 300. The integer sequence is sent in parallel to plural compressors 310(1), 310(2) . . . 310(N), each with different compression formats. Thus, the integer sequence 300 may be sent to one or more of integer compressors 310 and, in this regard, IC 220 may comprise one or any number of integer compression algorithms (e.g., IC algorithms that are optimized for non-negative integers, integers of constant length, Elias coding, Rice coding, delta coding, etc.). The number and format of ICs may be customized for a particular application or implementation.

Each integer compressor 310 produces its own corresponding set of compressed bits or bit streams, which are sent at steps 320(1)-320(N). The smallest number or shortest length of bits from among the bits sent at 320 is selected at step 330 for output at step 340. The compressed count, compressed exponent and compressed mantissa. are concatenated to form concatenated triplets sent at 230 for forwarding to select shortest bits triplet module 240.

Thus, the underlying integer compressor module (e.g., IC (220)) takes a finite sequence of integers received at step 300 and returns a bit stream at step 340, which represents those integers compactly. In another example, the integer compressor 220 could produce a compressed bit stream containing a format selector, followed by a bit stream whose contents are interpreted according the format selector. Some possible formats are:

1) all values in the integer sequence are the same constant value of size N bits, where N<256. This example format might use 8+N bits to represent a sequence of arbitrary length;

2) all values in the integer sequence are non-negative integers less than $2^N$ for some N<256. This format might use 8+N*M bits to represent a sequence of M values;

3) all values are integers offset from a base value X, with signed offsets in the range $-2^{(N-1)} \ldots ((2^N)-1)$; this format might use 8+32+N*M bits to represent a sequence of M values;

4) a dictionary-coded representation with Q distinct values of length N bits each, taking Q*N+M*log_2(Q) bits total;

5) a run-length encoded scheme;

6) a delta-coded scheme for storing the difference between consecutive values; or 7) the results of any off-the shelf compressor.

The integer compressor may act as if it compresses the values in all available formats, for example, 310(1), 310(2), 310(N), and chooses the format that produces the smallest representation. Thus, as the data are processed (e.g., by or prior to processing by floating-point analysis module 16 and floating-point compression module 20), the floating-point compression techniques may take advantage of patterns in the data.

Compression modules used to compress components of a floating-point value (e.g. exponent, digit count, mantissa) may comprise any number of or type compressors that receive data in any number of formats (e.g., decimal, binary, ASCII, etc.) and compress the data on any number of compression formats (e.g., constant size data sequences, non-negative data sequences, differences between values, etc.).

The source data (e.g., binary floating-point data) may be compressed using any radix or base (e.g., base-8, base-10, etc.) and compressed using any number of serial or parallel processing paths. For example, parallel compression processing paths may include raw data compression, exponent normalization, mantissa normalization or any combination thereof. Further processing paths may include techniques to group data or identify data values that are considered outliers relative to the group for special processing. During compression, metadata, may be generated to further identify blocks of compressed data that include similar characteristics (e.g., a same length, a same exponent, etc.), or other useful data such as compression statistics.

The output 340 may map to individual ones of bit streams 230 depicted in FIG. 2. Furthermore, prior to compression the individual values in the count, exponent and mantissa may be separated by how many digits they contain prior to compression. The digits may be compressed directly from the ASCII or as an integer, where the entropy is the same either way. After the initial conversion from binary floating-point to decimal digit triplets, all values or all values in a group of data, may be right-zero-padded to a common length so that the number of digits is constant and need not be separately represented (i.e., exponent or length normalization). When floating-point compression does not yield appreciable benefits, for example, when the number of digits is otherwise close to the maximum required for the storing the data in floating-point format, the compression techniques may be bypassed.

Other implementation options may not rely on an ASCII representation, but still allow for a minimal bit-wise representation of the underlying data. During decompression, the decompressor, if in hardware, may not need to he a general-purpose integer-to-floating-point converter. For example, during compression, recognition may be limited to cases where the number of digits is 0-6, and supply 7 separate data paths through the decompressor(s), which may be specialized for digits 0-6.

The output (e.g., compressed triplets) may be processed based on hatches or pages of data. By way of example, a page of data may be 128 KB, while 24 pages of data or 3 MB (i.e., 128 KB×24 pages=3 MB) may be defined as an extent. Alternatively, a batch may consist of a fixed maximum number of values, for example, 5000 values). Similarly, the compressed data (e.g., triplets) may be stored in hatches or pages. For example, depending on compression efficiency, various amounts of compressed data may be stored until a defined data unit is complete or filled up, thereby providing incremental compression data units.

The underlying source data may contain patterns that provide for batches of data that have similar characteristics (e.g., similar precision) for which compression efficiencies may be obtained such that groups of data with similar characteristics may be compressed separately and stored with metadata that delineates groups of compressed data. These batches may be determined by collecting values in the order in which they are received up to a threshold number of values, or by sorting or otherwise correlating values to obtain better compression.

It will be appreciated that the embodiments described above and illustrated in the drawings represent only a few of the many ways of implementing compression of floating-point data by identifying a previous loss of precision.

The environment of the present invention embodiments may include any number of computer or other processing systems (e.g., client or end-user systems, host systems, data servers, etc) and databases or other repositories arranged in any desired fashion, where the present invention embodiments may be applied to any desired type of computing environment (e.g., cloud computing, client-server, network computing, mainframe, stand-alone systems, etc.). The computer or other processing systems employed by the present invention embodiments may be implemented by any number of any personal or other type of computer or processing system (e.g., desktop, laptop, PDA, mobile devices, etc.), and may include any commercially available operating system and any combination of commercially available and custom software (e.g., browser software, communications software, server software, floating-point analysis module, floating-point compression module, etc.). These systems may include any types of monitors and input devices (e.g., keyboard, mouse, voice recognition, etc.) to enter and/or view information.

It is to be understood that the software (e.g., floating-point analysis module, floating-point compression module, etc.) of the present invention embodiments may be implemented in any desired computer language and could be developed by one of ordinary skill in the computer arts based on the functional descriptions contained in the specification and flow charts illustrated in the drawings. Further, any references herein of software performing various functions generally refer to computer systems or processors performing those functions under software control. The computer systems of the present invention embodiments may alternatively be implemented by any type of hardware and/or other processing circuitry.

The various functions of the computer or other processing systems may be distributed in any manner among any number of software and/or hardware modules or units, processing or computer systems and/or circuitry, where the computer or processing systems may be disposed locally or remotely of each other and communicate via any suitable communications medium (e.g., LAN, WAN, intranet, Internet, hardwire, modem connection, wireless, etc). For example, the functions of the present invention embodiments may be distributed in any manner among the various end-user/client, data servers, and host systems, and/or any other intermediary processing devices. The software and/or algorithms described above and illustrated in the flow charts may be modified in any manner that accomplishes the functions described herein. In addition, the functions in the flow charts or description may be performed in any order that accomplishes a desired operation.

The software of the present invention embodiments (e.g., floating-point analysis module, floating-point compression module, etc.) may be available on a non-transitory computer useable medium (e.g., magnetic or optical mediums, magneto-optic mediums, floppy diskettes, CD-ROM, DVD, memory devices, etc.) of a stationary or portable program product apparatus or device for use on stand-alone systems or systems connected by a network or other communications medium.

The communication network may be implemented by any number of any type of communications network (e.g., LAN, WAN, Internet, intranet, VPN, etc.). The computer or other processing systems of the present invention embodiments may include any conventional or other communications devices to communicate over the network via any conventional or other protocols. The computer or other processing systems may utilize any type of connection (e.g., wired, wireless, etc.) for access to the network. Local communication media may be implemented by any suitable communication media (e.g., local area network (LAN), hardwire, wireless link, intranet, etc.).

The system may employ any number of any conventional or other databases, data stores or storage structures (e.g., files, databases, data structures, data or other repositories, etc.) to store information (e.g., data, compressed data, metadata, etc.). The database system may be implemented by any number of any conventional or other databases, data stores or storage structures (e.g., files, databases, data structures or tables, data or other repositories, etc.) to store information (e.g., data, compression statistics, etc.). The database system may be included within or coupled to the server, data servers and/or client systems. The database systems and/or storage structures may be remote from or local to the computer or other processing systems, and may store any desired data (e.g., data, compressed data, metadata, etc.). Further, the various tables (e.g., data, compressed data, metadata, etc.) may be implemented by any conventional or other data structures (e.g., files, arrays, lists, stacks, queues, etc.) to store information, and may he stored in any desired storage unit (e.g., database, data or other repositories, etc.).

The present invention embodiments may employ any number of any type of user interface (e.g., Graphical User interface (GUI), command-line, prompt, etc.) for obtaining or providing information (e.g., databases, compression statistics, etc.), where the interface may include any information arranged in any fashion. The interface may include any number of any types of input or actuation mechanisms (e.g., buttons, icons, fields, boxes, links, etc.) disposed at any locations to enter/display information and initiate desired actions via any suitable input devices (e.g., mouse, keyboard, etc.). The interface screens may include any suitable actuators (e.g., links, tabs, etc.) to navigate between the screens in any fashion.

Any reports generated using the technique described herein may include any information arranged in any fashion, and may be configurable based on rules or other criteria to provide desired information to a user (e.g., compression statistics, etc.). The compression statistics may provide an indication of compression efficiency along various compression processing paths or the frequencies of path selection to indicate which data paths were selected for forwarding. Based on the compression statistics, the techniques may be modified or improved, and may be adapted for the types of data that may be processed.

The present invention embodiments are not limited to the specific tasks or algorithms described above, but may be utilized for analyzing and compressing floating-point data associated with any type of database, memory or any other storage structure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes", "including", "has", "have", "having", "with" and the like, when used in this specification, specify the presence of stated features, integers, steps, operations, elements, and/or components, but do not preclude the presence or addition of one or more other features, integers, steps, operations, elements, components, and/or groups thereof The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A computer-implemented method of compressing floating-point data comprising:
    converting each binary floating-point value in a set of binary floating-point values to a decimal floating-point value;
    determining data for each decimal floating-point value including an exponent, a mantissa, and a quantity of decimal digits of the mantissa; and
    individually compressing the exponents, the mantissas and the quantity of decimal digits of the decimal floating-point values and producing compressed floating-point values based on the individual compressions.

2. The computer-implemented method of claim 1, wherein the converting includes generating a mantissa with a minimum number of digits.

3. The computer-implemented method of claim 2, wherein the determining data includes determining whether one or more of the exponent and the quantity of decimal digits are constant for the decimal floating-point values.

4. The computer-implemented method of claim 1, wherein the individually compressing includes:
    analyzing the determined data to identify reduced precision within the decimal floating-point values and producing the compressed floating-point values based on the reduced precision.

5. The computer-implemented method of claim 1, wherein the converting includes at least one from the group of:
    normalizing a position of a decimal point; and
    normalizing a length of a mantissa.

6. The computer-implemented method of claim 1, wherein the individually compressing includes:
    compressing the exponents, the mantissas and the quantity of decimal digits of the decimal floating-point values using a plurality of compression formats.

7. The computer-implemented method of claim 6, wherein the individually compressing includes:
    selecting a compressed exponent, a compressed mantissa and a compressed quantity of decimal digits with a shortest bit length from results of the compressing using the plurality of compression formats.

8. The computer-implemented method of claim 1, wherein each converted binary floating-point value comprises a corresponding set of the exponent, the mantissa and the quantity of decimal digits to form a data triplet for the individually compressing the exponents, the mantissas and the quantity of decimal digits, the computer-implemented method further comprising:
    processing each data triplet among plural parallel processing paths, wherein each processing path includes one or more from the group of:
        compressing the values in each data triplet;
        normalizing the exponent in each data triplet and compressing the values in each data triplet;
        normalizing the mantissa length in each data triplet and compressing the values in each data triplet; and
        normalizing the exponent and the mantissa length in each data triplet and compressing the values in each data triplet; and
    selecting a compressed data triplet comprising a shortest bit length from among the compressed data triplets processed among the plural parallel processing paths.

* * * * *